(12) United States Patent
Alam (10) Patent No.: US 7,506,229 B2
(45) Date of Patent: Mar. 17, 2009

(54) METHOD AND SYSTEM FOR OPTIMIZING AN INTEGRATED CIRCUIT

(75) Inventor: Akhtar Alam, Varanasi (IN)

(73) Assignee: Interra Systems Inc, San Jose, CA (US)

( * ) Notice: Subject to any disclaimer, the term of this patent is extended or adjusted under 35 U.S.C. 154(b) by 481 days.

(21) Appl. No.: 11/394,990

(22) Filed: Mar. 30, 2006

(65) Prior Publication Data

US 2007/0245183 A1    Oct. 18, 2007

(51) Int. Cl.
*G01R 31/28* (2006.01)
*G06F 3/00* (2006.01)

(52) U.S. Cl. .................... 714/724; 714/738
(58) Field of Classification Search ............. 714/724, 714/738, 740, 701, 759, 799, 745
See application file for complete search history.

(56) References Cited

U.S. PATENT DOCUMENTS 6,185,722 B1 *    2/2001    Darden et al. ............... 716/5

* cited by examiner

*Primary Examiner*—Phung M Chung (57) ABSTRACT

A method and system for optimizing an integrated circuit is described. The method includes generating (102) a characteristic table of the integrated circuit. The method further includes selecting (104) a functional module from one or more functional modules. Moreover, the method includes receiving (106) at least an input load or an output load, or both, corresponding to the functional module. Further still, the method includes calculating (108) size of a plurality of transistors in the functional module. The system includes a characteristic table generator (302) and an optimizer unit (304). The characteristic table generator (302) generates the characteristic table. The optimizer unit (304) selects the functional module from the one or more functional modules. The optimizer unit (302) further resizes the plurality of transistors in the functional module.

24 Claims, 10 Drawing Sheets

METHOD AND SYSTEM FOR OPTIMIZING AN INTEGRATED CIRCUIT

FIELD OF THE INVENTION

The present invention generally relates to the field of design of integrated circuits. More specifically, it relates to the field of optimizing an integrated circuit with respect to one or more parameters.

BACKGROUND OF THE INVENTION

Designing an Integrated Circuit (IC) involves performing a sequence of design steps. The initial steps include entering a transistor-level design description or a Hardware Description Language (HDL) based design description into an automated IC design system. Thereafter, a netlist is generated by the IC design system. The netlist is a textual representation of the interconnection of components in the IC. Further, the netlist is simulated to verify that the IC design conforms to specifications. Thereafter, a layout of the IC design is generated either manually or automatically from the netlist. The layout includes technology-level details of design components and parasitics associated with the design. The technology-level details of the design components include, for example, sizes of metal lines, and sizes of polysilicon lines. The parasitics include, for example, capacitances between diffusion regions and the substrate and channel capacitances. A layout netlist is then extracted from the layout of the IC design using automatic tools. Simulations are then run on the extracted netlist to ensure that the layout design conforms to the specifications. In case the extracted netlist does not conform to the specifications, the transistor-level description or the HDL description is modified, to generate a new netlist. Usually, in this process, a number of iterations in the IC design have to be performed.

Performing transistor-level IC design includes sizing of transistors in the IC design. Sizing of transistors include calculating sizes of transistors in the IC design for optimum value of a parameter of the IC design. A parameter of the IC design includes, for example, minimum delay, minimum area and minimum current. Sizing of transistors is laborious and time-consuming process. In case there are a number of iterations in the IC design, the process of sizing the transistors has to be repeated. This may cause significant delay in design tape-out and time-to-market for an integrated circuit.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail the method and system for optimizing an integrated circuit for at least one parameter from a set of parameters, it should be observed that the present invention resides primarily in the method steps and system components, which are employed to optimize an integrated circuit for at least one parameter from the set of parameters. Accordingly, the method steps and apparatus components have been represented where appropriate by conventional symbols in the drawings, showing only those specific details that are pertinent to understanding the present invention, so as not to obscure the disclosure with details that will be readily apparent to those of ordinary skill in the art having the benefit of the description herein.

In this document, relational terms such as first and second, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

A "set" as used in this document, means a non-empty set (i.e., comprising at least one member). The term "another", as used herein, is defined as at least a second or more. The terms "include" and/or "including", as used herein, are defined as comprising.

In an embodiment of the invention, a method for optimizing an integrated circuit for at least one parameter from a set of parameters is disclosed. The integrated circuit includes one or more functional modules. These functional modules include a plurality of transistors. The method includes generating a characteristic table for the integrated circuit. The characteristic table includes a logical effort value corresponding to each unique logic unit of the integrated circuit. The method further includes selecting a functional module from the one or more functional modules. The method further includes receiving an input load or an output load, or both, corresponding to the functional module. Thereafter, the method includes calculating the size of the plurality of transistors in the functional module, based on the characteristic table and at least one of the input load, the output load, or both.

In another embodiment of the invention, a method for optimizing an integrated circuit for at least one parameter from a set of parameters is disclosed. The integrated circuit includes one or more functional modules. Each functional module includes a plurality of transistors. The method includes generating a characteristic table for the integrated circuit. The characteristic table includes a logical effort value corresponding to each unique logic unit of the integrated circuit. The method further includes selecting a functional module from the one or more functional modules. Further, the method includes receiving an input load or an output load, or both, corresponding to the functional module. Further, the method includes selecting an output signal transition corresponding to the functional module. The method also includes identifying a set of transistors from the plurality of transistors, based on the output signal transition. The method further includes calculating the size of the plurality of transistors in the functional module, based on the characteristic table, at least one of the input load or the output load; and the identification of the set of transistors.

In yet another embodiment of the invention, a system for optimizing an integrated circuit for at least one parameter from a set of parameters is disclosed. The integrated circuit includes one or more functional modules. The functional modules include a plurality of transistors. The system includes a characteristic table generator, capable of generating a characteristic table. The characteristic table includes a logical effort value corresponding to each unique logic unit in the integrated circuit. The system also includes an optimizer unit, operatively coupled to the characteristic table generator. The optimizer unit is arranged to resize the plurality of transistors in the functional module.

Figure 1:
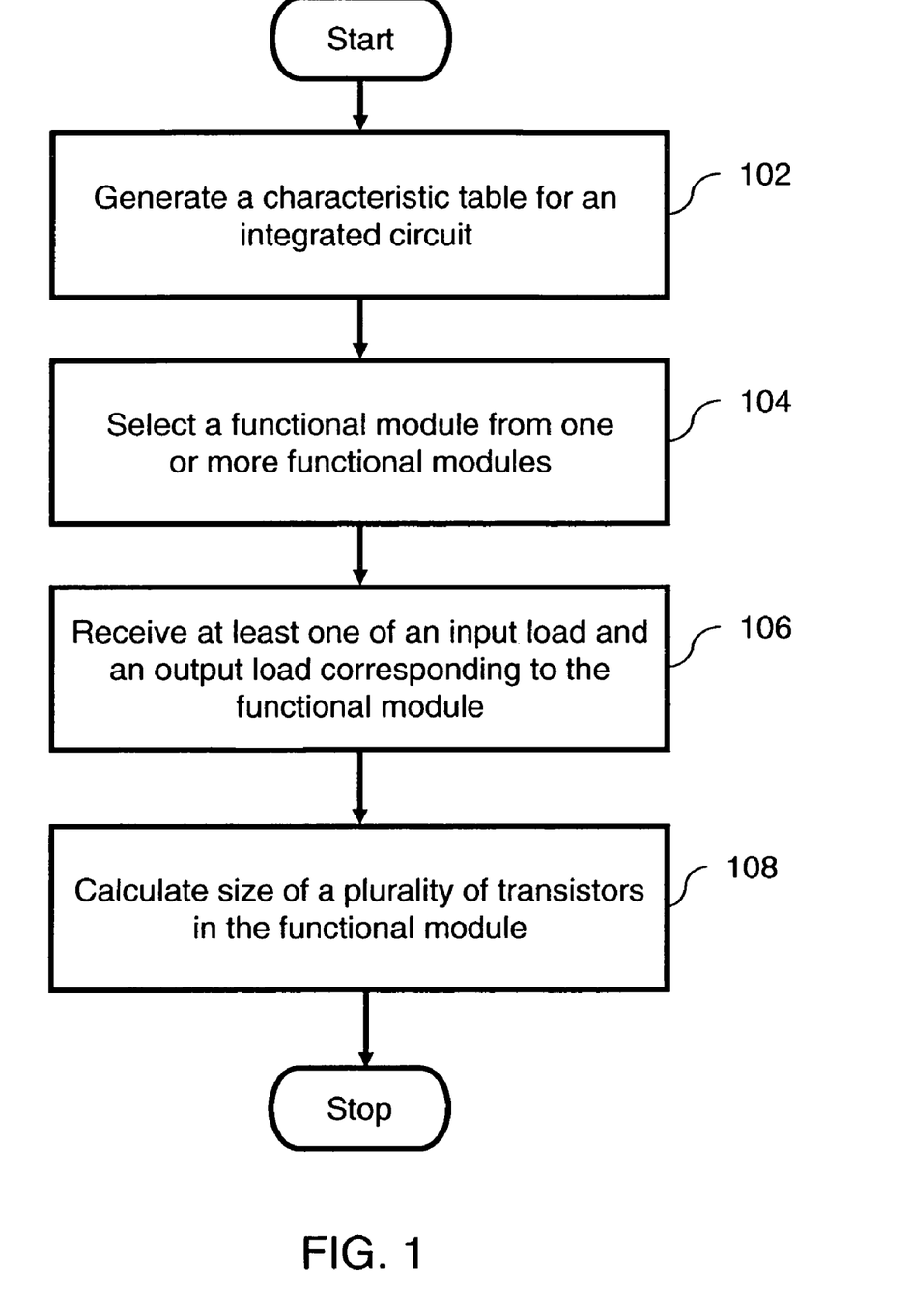
FIG. 1 is a flowchart illustrating a method for optimizing an integrated circuit, in accordance with an embodiment of the invention.

FIG. 1 is a flowchart illustrating a method for optimizing an Integrated Circuit (IC) for at least one parameter from a set of parameters, in accordance with an embodiment of the present invention. The set of parameters include, for example, minimum delay of a critical path, minimum area of a critical path and minimum power of a critical path. The IC can include one or more functional modules. An example of the functional module includes, a module with one or more logic units interconnected to generate a logic function. Each functional module includes a plurality of transistors. At step 102, a characteristic table is generated for the IC. The characteristic table includes a value of a logical effort corresponding to each unique logic unit of the IC. The logical effort of a logic unit is a term used to describe delay due to topological properties of the logic unit. Delay through a logic unit includes delay due to load at output of the logic unit and delay due to topological properties of the logic unit. In an embodiment of the present invention, when the logical effort value of an inverter is one, the logical effort value of a logic unit, such as a NAND gate, describes the current driving capability of the NAND gate, with respect to the inverter.

At step 104, a functional module from one or more functional modules of the IC is selected for being optimized. In an embodiment of the present invention, the functional module is selected automatically. In another embodiment of the present invention, identification of the functional module is received as input. At step 106, an input load or an output load, or both, corresponding to the functional module is received as input. In an embodiment of the present invention, both the input load and the output load are received as input. In another embodiment of the present invention, the input load is received as input and the output load is extracted from a spice netlist of the IC. A spice netlist is a netlist of the IC generated by the SPICE IC design tool. At step 108, the size of the plurality of transistors in the functional module is calculated for optimizing the IC for at least one parameter from a set of parameters. In an embodiment of the present invention, the size of the plurality of transistors is calculated in each logical path of the functional module. A logical path is a path in the IC with an interconnection of two or more logic units forming a logic function. The method provides as a result, the values of sizes of the plurality of transistors in a tabular form. In another embodiment of the present invention, the method generates a spice netlist with the calculated size of the plurality of transistors.

FIGS. 2a, 2b, 2c, 2d, 2e and 2f illustrate a flowchart that presents a method for optimizing an IC, in accordance with another embodiment of the present invention. The set of parameters include, for example, minimum delay of a critical path, minimum area of a critical path and minimum power of a critical path. In this embodiment, logical effort value of an inverter is specified as ONE. At step 202, a characteristic table of the integrated circuit is generated. The characteristic table is generated based on, for example, a formula method, a datasheet method, a look-up table method and a simulation method. The formula method involves extracting logic units from the spice netlist of the IC and calculating a logical effort value corresponding to each unique logic unit, based on a pre-defined criterion. In an exemplary case, the pre-defined criterion is checking whether the logical effort value of a logic unit is equivalent to the ratio of input capacitance of the logic unit to input capacitance of an inverter that delivers the same output current as the logic unit. The datasheet method includes using a datasheet of each unique logic unit in the IC and datasheet of an inverter, to calculate the logical effort value of each unique logic unit. The datasheet of a logic unit includes a tabulation of values of signal delays through the logic unit. corresponding to various loads at the output of the logic unit. For example, the various load values at the output of the logic unit are multiples of a standard load value, which corresponds to 20 Femtofarad (fF). In the datasheet method, the logical effort value of the logic unit is equivalent to the ratio of a first slope value to a second slope value. The first slope value is the slope of the curve of the logic unit's delay versus output load obtained from the datasheet of the logic unit. The second slope value is the slope of the curve of an inverter's delay versus output load obtained from the datasheet of the inverter. From the datasheet of each unique logic unit, a ratio of difference between two consecutive delay values and the difference between the two corresponding load values can be calculated to obtain a first set of slope values. In an embodiment of the present invention, a technology factor is provided with the datasheet and the difference between the two consecutive delay values is divided by the technology factor before the ratio is calculated to obtain the slope values. The technology factor is specific to the process used in fabrication of the IC, for example a 0.35 um process, and is a measure of delay in an inverter for a particular process. In an example, the technology factor is calculated for the particular process by using a ring-oscillator circuit. For example, the first slope value for each unique logic unit is calculated by taking an average of the first set of slope values. Similarly, the second slope value is calculated for the inverter. Finally, the ratio of the first slope value of each unique logic unit to second slope value of the inverter is obtained as the logical effort value of each unique logic unit.

Figure 2A:
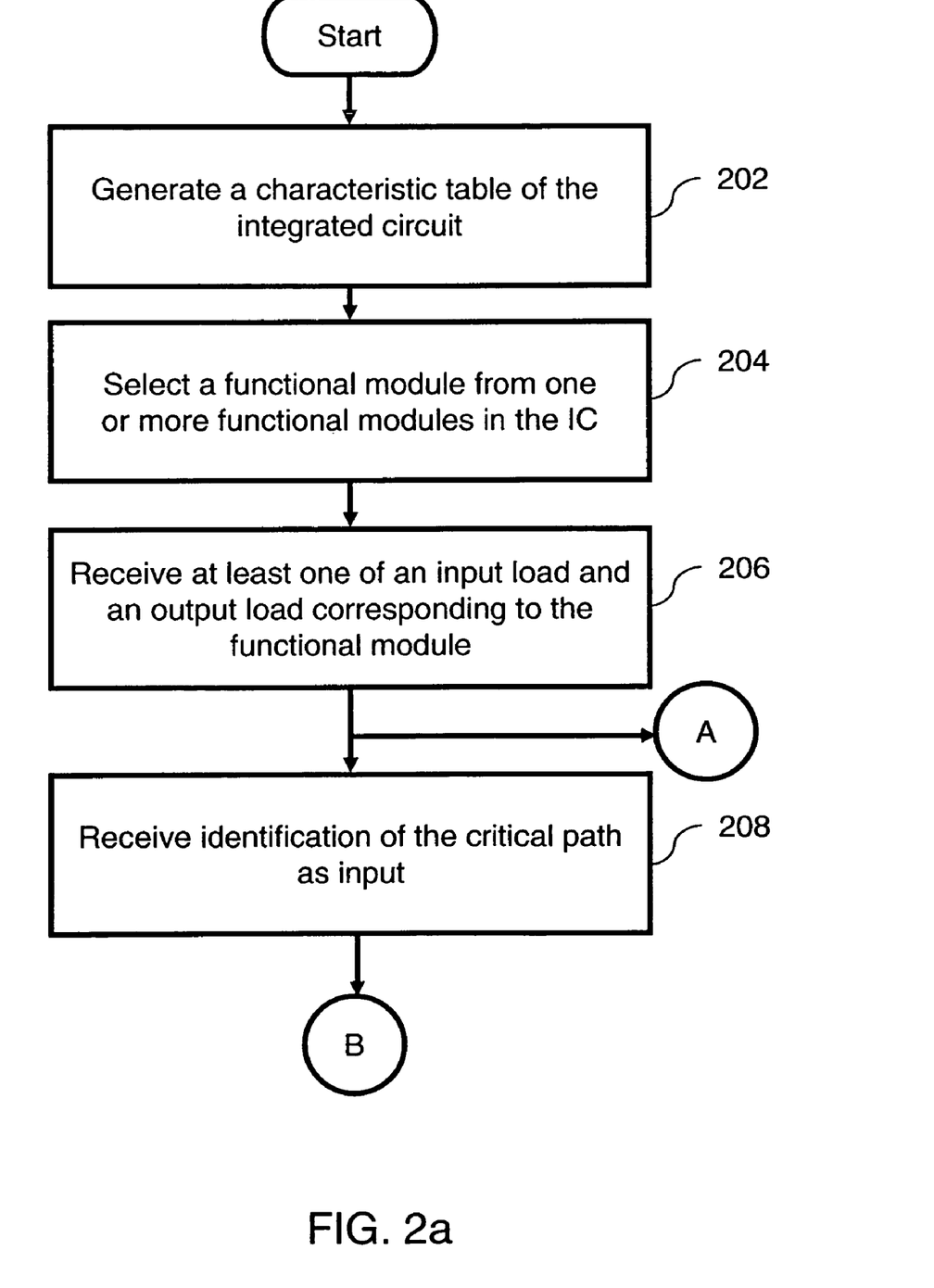
FIGS. 2a, 2b, 2c, 2d, 2e and 2f illustrate a flowchart of a method for optimizing an integrated circuit, in accordance with another embodiment of the invention.

The lookup table method includes receiving a logical effort value corresponding to each unique logic unit as input. The simulation method includes selecting a logic unit, based on a spice netlist and a verilog stub file of the IC. The verilog stub file of an IC is a textual representation of the input and output ports in the IC. Delay of a signal through the logic unit is calculated for a load value and delay of a signal through an inverter is calculated for the same load value. A slope value for the logic unit is determined by calculating the ratio of signal delay through the logic unit corresponding to the load value. Further, a slope value for the inverter is determined by calculating the ratio of signal delay through the inverter and the corresponding load value. Finally, the ratio of slope value for the logic unit to the slope value for the inverter is calculated. Similarly, slope values for the logic unit and the inverter are calculated for increasing load values, and ratio of the slope values for the logic unit to the slope values for the inverter are calculated till a limiting value of the ratio is achieved. The limiting value of the ratio is the logical effort value.

Figure 2B:
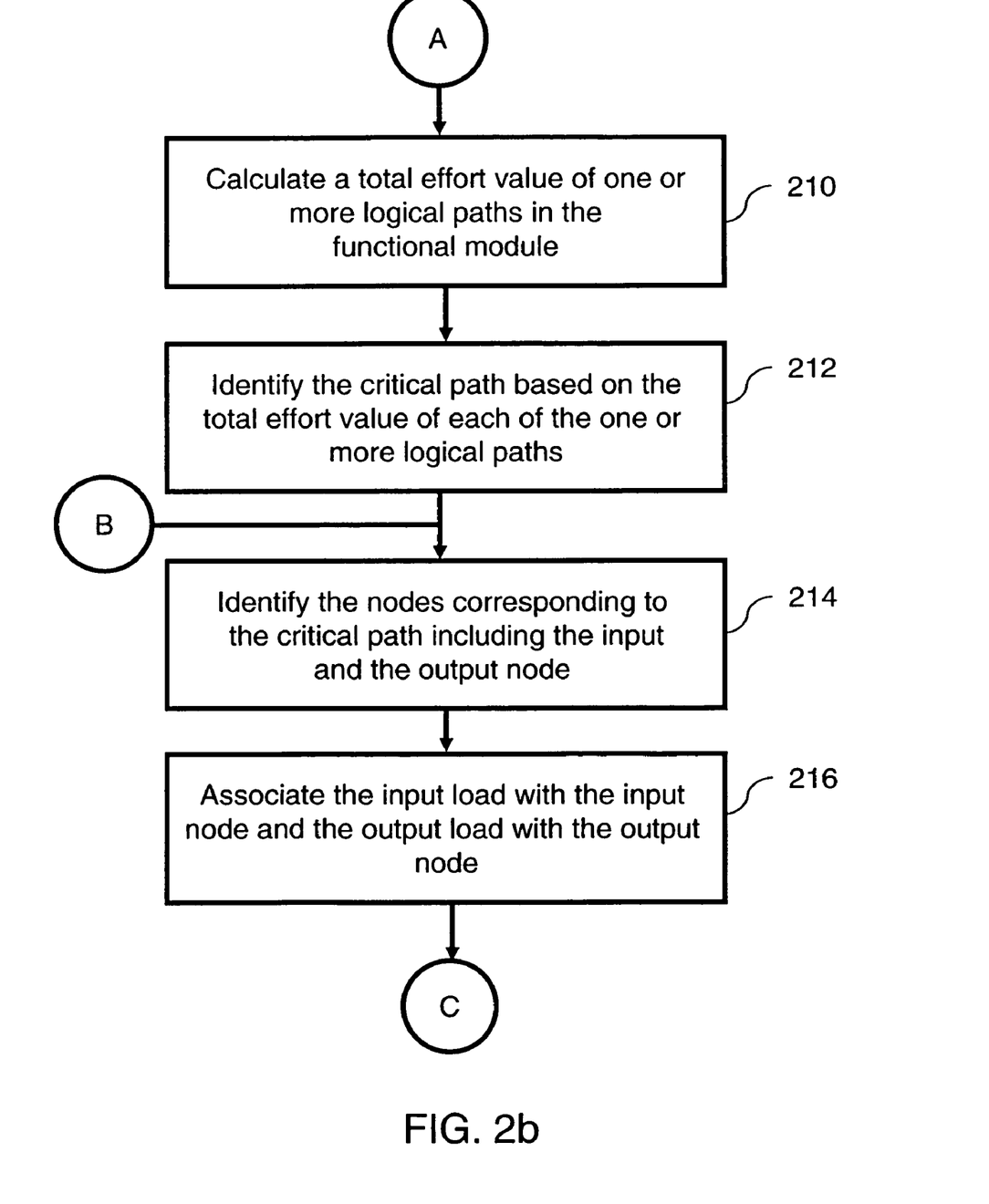

At step 204, a functional module from one or more functional modules of the IC is selected. In an embodiment of the present invention, the functional module is selected for optimizing the functional module. In an embodiment of the present invention, the functional module is selected automatically. In another embodiment of the present invention, the functional module is selected manually. At step 206, an input load or an output load, or both, corresponding to the functional module is received as input. In an embodiment of the present invention, both the input load and the output load are received as input. In another embodiment of the present invention, the input load is received as input and the output load is extracted from the spice netlist of the IC.

Figure 2C:
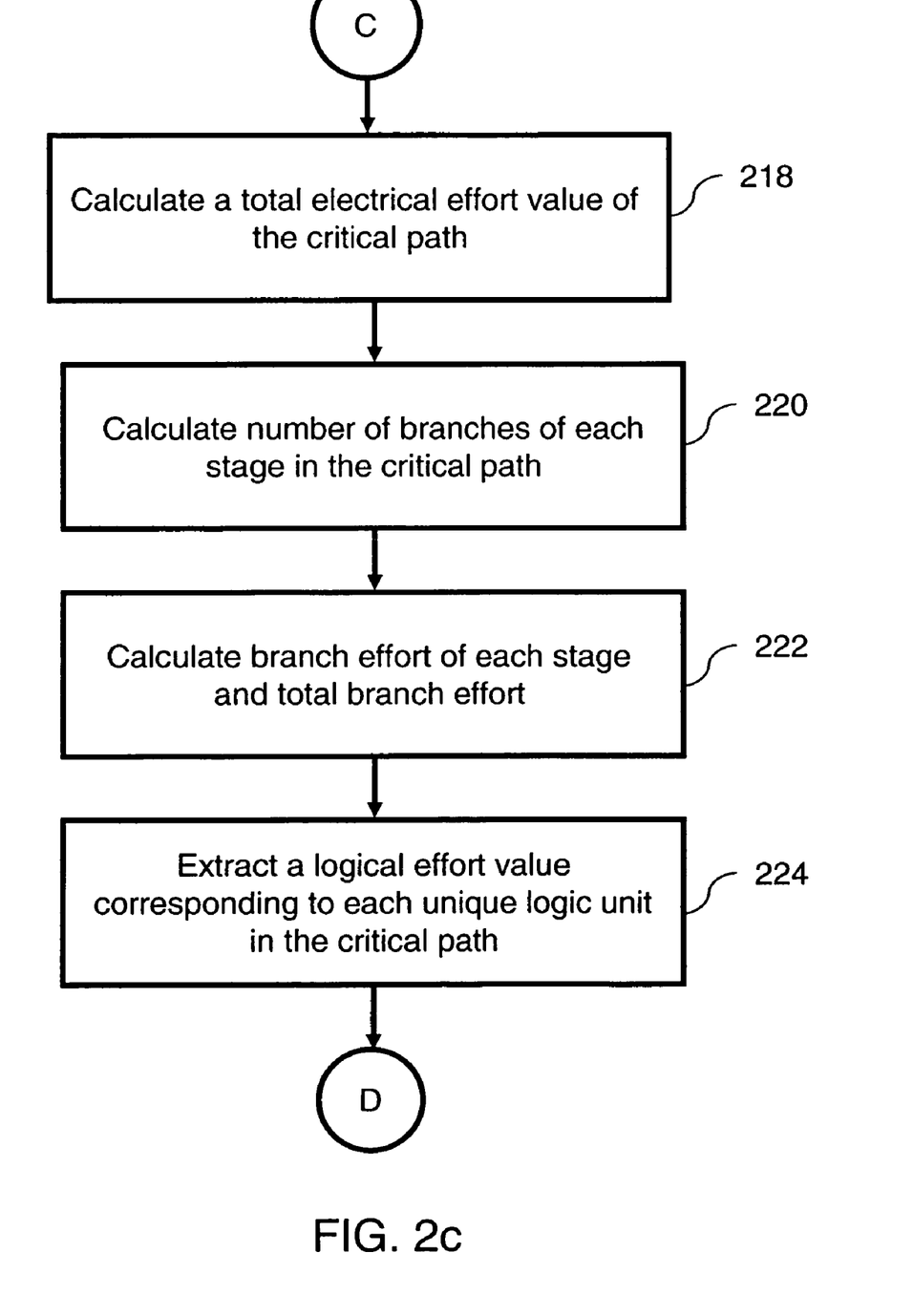

In an embodiment of the present invention, at step 208, identification of the critical path is received as input. A critical path of the IC is a logical path with maximum signal delay between the input and output node. In another embodiment of the present invention, the critical path is determined automatically. In this embodiment at step 210, a total effort value for one or more logical paths in the functional module is calculated. The total effort of a logical path is a term used to describe the total signal delay between an input node and an output node of the logical path. The total effort values corresponding to all the logical paths in the functional module are calculated. Thereafter in this embodiment, at step 212, the critical path in the functional module is identified, based on the total effort values corresponding to all the logical paths in the functional module. The logical path with the maximum total effort value is determined as the critical path. At step 214, nodes corresponding to the critical path are identified from the spice netlist. At step 216, the input node of the critical path is associated with the input load and the output node is associated with the output load. At step 218, a total electrical effort value of the critical path is determined. Electrical effort of a logical path is a term used to account for delay due to load at the output of the logical path. Electrical effort (H) of the critical path can be calculated using the following equation:

$$H = \frac{C_{out}}{C_{in}} \quad (1)$$

where, $C_{out}$ is the capacitance at the output of the logical path and; $C_{in}$ is the capacitance at the input of the logical path.

At step 220, the number of branches of each logic stage in the critical path is calculated. A logic stage of a logical path includes a single logic unit or an interconnection of logic units incorporating fanout. An example of a fanout may include output of a logic unit being connected to input of more than one logic units. At step 222, the branch effort of each logic stage in the critical path and total branch effort of the critical path is calculated. Branch effort is a term used to account for fanout in a logic stage within the logical path. In case of a fanout within the logical path, some drive current within a logic stage is directed off the path and towards the other branches in the logic stage. Branch effort (b) of a logic stage in the critical path can be calculated using the following equation:

$$b = \frac{C_{on\text{-}path} + C_{off\text{-}path}}{C_{on\text{-}path}} \quad (2)$$

where, $C_{on\text{-}path}$ is the load capacitance along the logical path; and $C_{off\text{-}path}$ is the capacitance of connections that lead off the path due to fan-out.

In an embodiment of the present invention, branch effort of a logic stage, which does not include any branches is taken as one. However, the total branch effort of a logical path is a multiplication of branch efforts of logic stages along the logical path. Total branch effort (B) of the critical path can be calculated using the following equation:

$$B = \Pi b_i \quad (3)$$

where, the subscript i indexes a logic stage in the logical path.

Figure 2D:
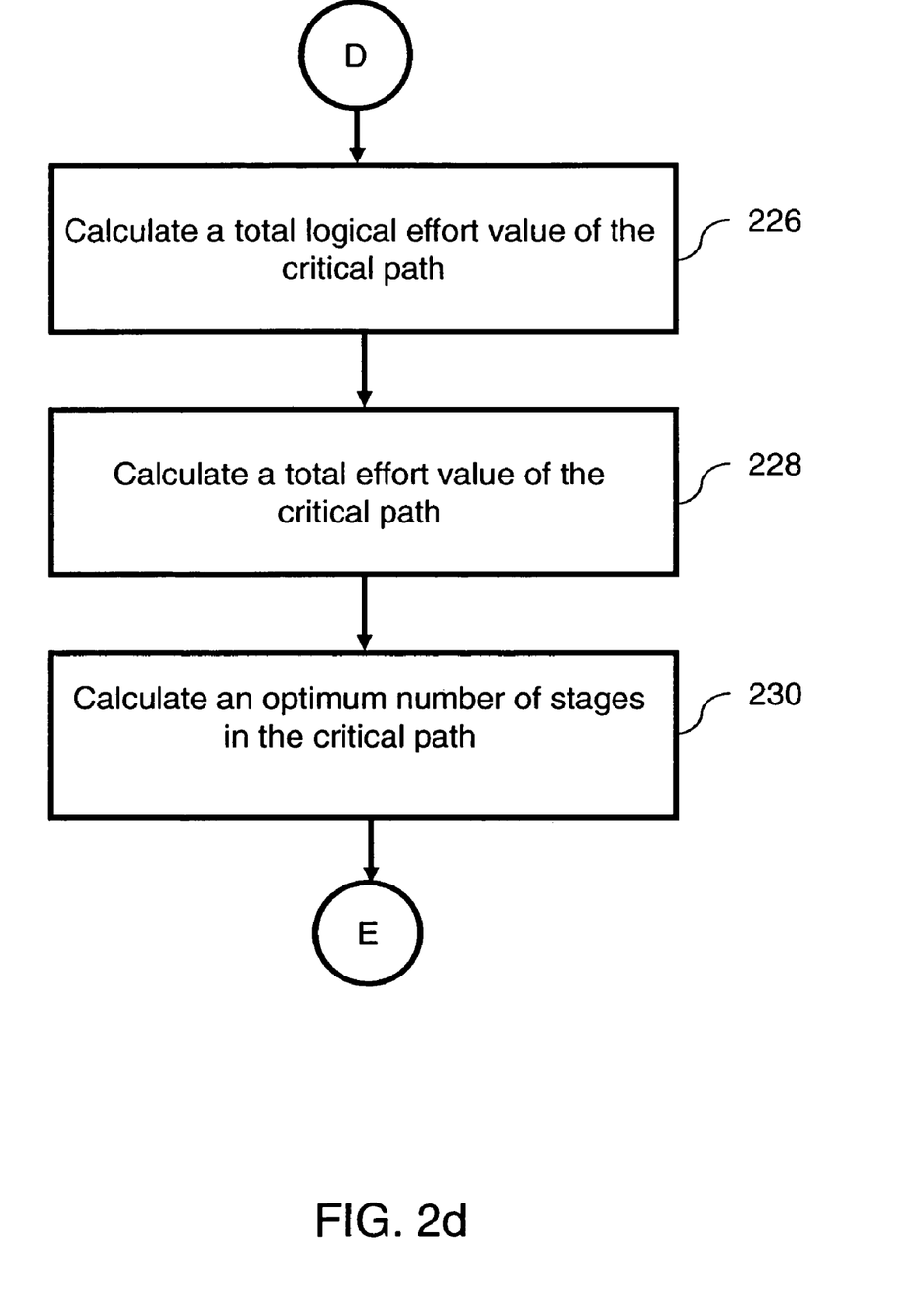

At step 224, logical effort values corresponding to each unique logic unit in the critical path are extracted from the characteristic table. At step 226, the total logical effort value (F) of the critical path is calculated. For example, the total logical effort value can be calculated by multiplying logical effort values of logic units along the critical path. The total logical effort (G) of the logical path can be calculated using the following equation:

$$G = \Pi g_i \quad (4)$$

where, g is the logical effort of a logic unit in the logical path; and the subscript i indexes a logic stage in the logical path.

At step 228, the total effort value of the critical path is calculated. Total effort value of a logical path is calculated by multiplying the total logical effort, total branch effort and total electrical effort of the logical path. Therefore, the total effort (F) of the critical path can calculated using the following equation:

$$F = G \times B \times H \quad (5)$$

At step 230, an optimum number of stages in the critical path is calculated. The optimum number of stages is calculated based on the total effort value and a parameter from the set of parameters. The set of parameters include, for example, minimum delay of the critical path, minimum area of the critical path and minimum power of the critical path. In an embodiment of the present invention, the optimum number of stages ($\hat{N}$) based on minimum signal delay through the critical path is calculated as $$\hat{N} = \log_4 F \quad (6)$$

In this embodiment, the signal delay through the critical path is calculated as $$\hat{D} = \hat{N} F^{\frac{1}{\hat{N}}} \quad (7)$$

In another embodiment of the present invention, the optimum number of stages ($\hat{N}$) for minimum area, current and power of the critical path is calculated, based on the total effort value and a set of step values of the critical path. A step value of the critical path is the ratio of sizes of successive logic units in the critical path. The step value of the critical path represents the stage effort that will result when the critical path uses a number of stages required to achieve least signal delay. This number of stages can be determined using the following equation:

$$\overset{est}{N} = \log_\rho F \qquad -(8)$$

where ρ is the step value of the critical path.

In an embodiment of the present invention, multiple values of the optimum number of stages are calculated corresponding to each step value from a set of step values of the critical path. In this embodiment, the set of step values is received as input. Further, an intermediate value of optimum number of stages is selected from the multiple values. Thereafter, a set of step values with a number of stages is selected, where each value from the set of values is close to an intermediate value of the optimum number of stages. In an example, the set of values include three intermediate values. Further, three values of delay through the critical path can be calculated using the following equation:

$$\hat{D} = \overset{set}{N} F^{\frac{1}{\overset{set}{N}}} \qquad (9)$$

where, $$\overset{set}{N}$$

corresponds to an independent value from the three intermediate values. In another embodiment of the present invention, three values for an area of the critical path are calculated. In an embodiment of the present invention, a value of the optimum number of stages $\hat{N}$ corresponding to each independent value is selected by the user, based on the three values of area and the three values of delay.

Figure 2E:
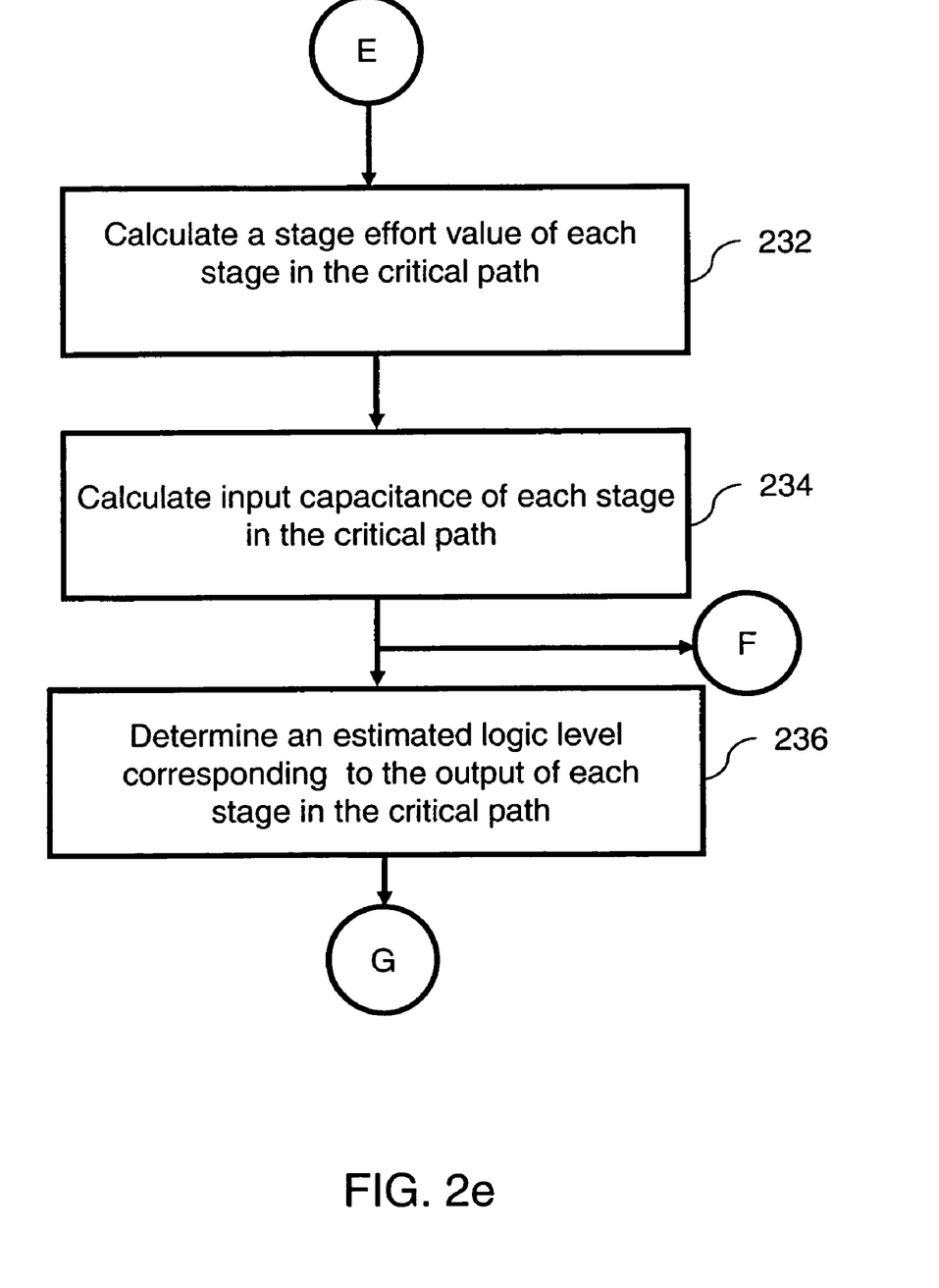

At step 232, a stage effort value corresponding to each logic stage in the critical path can be calculated, based on the following equation:

$$\hat{f} = F^{\frac{1}{\hat{N}}} \qquad (10)$$

At step 234, input capacitance of each stage in the critical path can be calculated using the following equation:

$$C_{in_i} = \frac{C_{out_i} \cdot g_i}{\hat{f}} \qquad (11)$$

where, the subscript i indexes a logic stage in the critical path, $C_{in_i}$ is input capacitance of the logic stage; and $C_{out_i}$ is output capacitance of the logic stage.

The value of $C_{in}$ for a logic stage becomes the value of $C_{out}$ for a previous logic stage. Therefore, the input capacitance of each stage in the critical path is calculated beginning from the output stage and tracing toward the input node in the critical path.

Figure 2F:
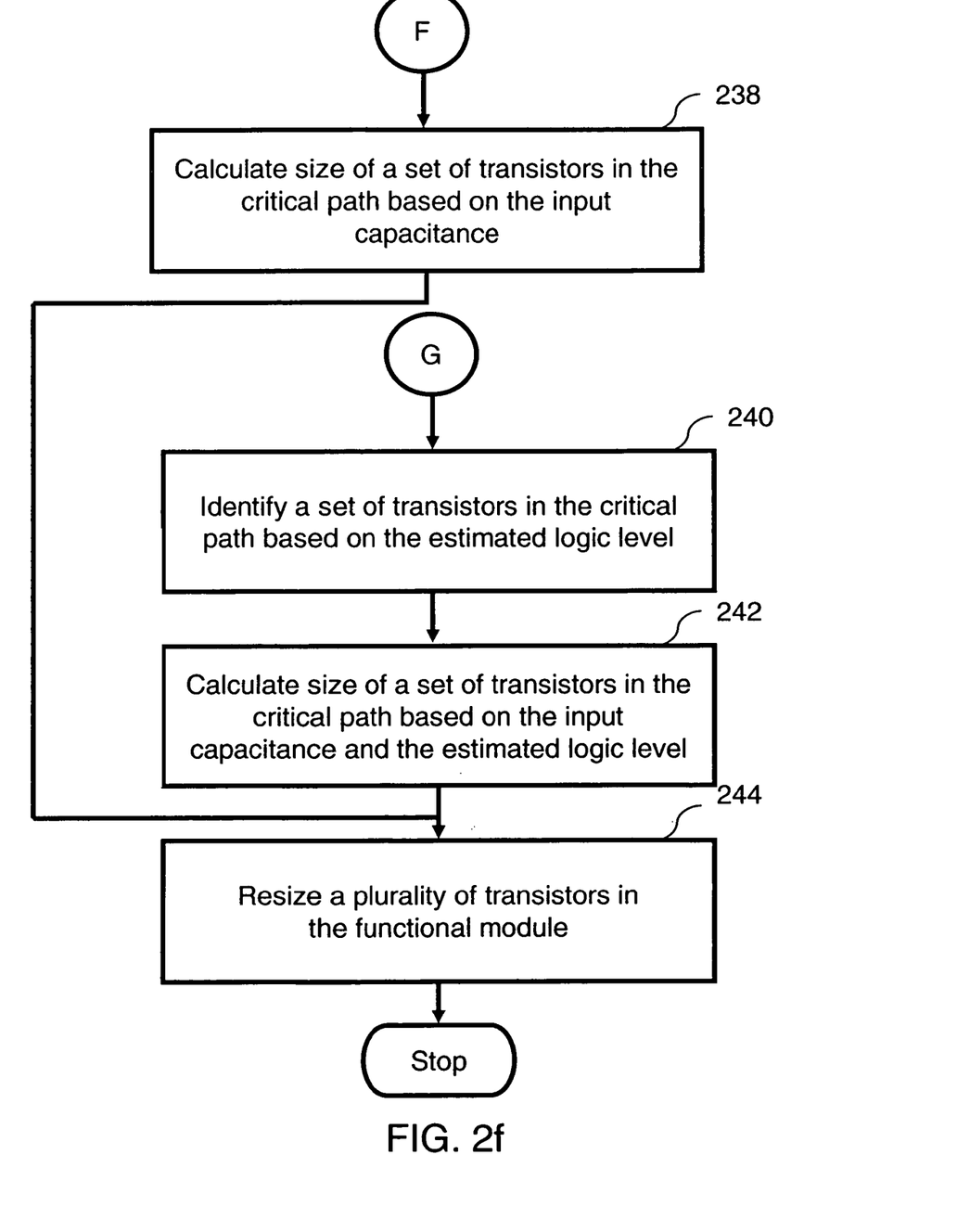

In an embodiment of the present invention, at step 236, an estimated logic level at the output of each logic stage is determined, corresponding to the rise or fall value of the output signal of the critical path. In an embodiment of the present invention, the transistors in the critical path are so sized that a parameter from the set of parameters is optimized for either a rise or a fall value of the output signal. In this embodiment, at step 240, a set of transistors that have to be sized are identified in the critical path, based on estimated logic levels at the output of each logic stage in the critical path. For example, if the estimated logic level at the output of a logic stage corresponding to a rise or fall value of the output signal is one, then, only the transistors in the logic stage responsible for pulling the logic level to one are sized based on a parameter from the set of parameters. The parameter includes but is not limited to, optimum delay, optimum area, optimum current etc. Thereafter, in this embodiment, at step 242, sizes of the set of identified transistors are calculated, based on the input capacitance of each stage and the estimated logic level of each logic stage in the critical path.

In another embodiment of the present invention, at step 238, the transistors in the functional module are so sized that a parameter from the set of parameters through the critical path is optimized, independent of the rise or fall value of the output signal. In this embodiment sizes of a set of transistors in the critical path are calculated, based on the input capacitance of each stage in the critical path. The set of transistors include all the transistors in the critical path.

At step 244, a plurality of transistors in the functional module are resized. The plurality of transistors are resized by selecting each logical path in the functional module and calculating the sizes of transistors in the each logical path by repeating step 210 to step 244 for each logical path.

Figure 3:
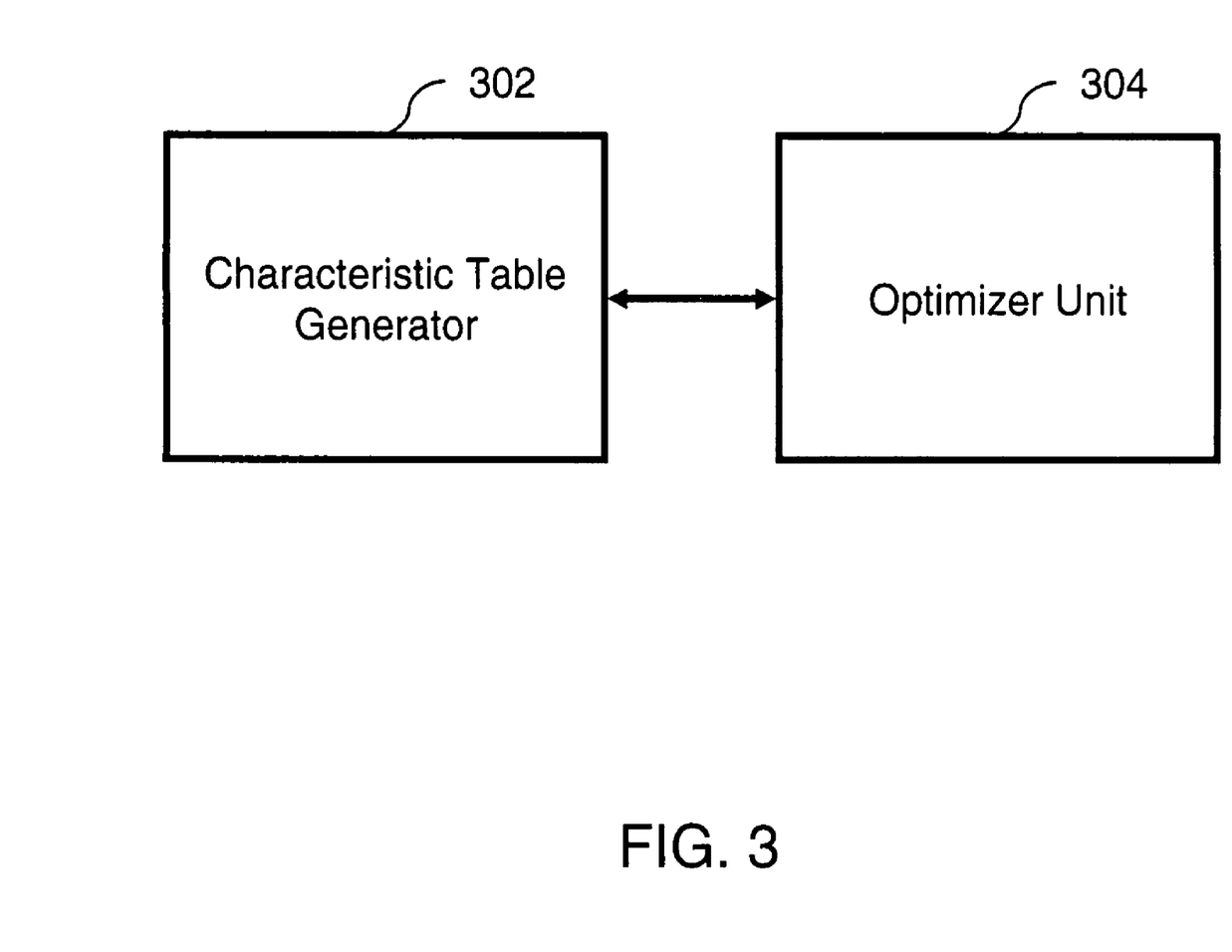
FIG. 3 is a block diagram depicting a system for optimizing an integrated circuit, in accordance with an embodiment of the invention.

FIG. 3 is a block diagram depicting a system for optimizing an integrated circuit (IC) for at least one parameter from a set of parameters, in accordance with an embodiment of the invention. The system includes a characteristic table generator 302 and an optimizer unit 304. The characteristic table generator 302 generates a characteristic table for the IC. The characteristic table includes a logical effort value, corresponding to each unique logic unit of the IC. The characteristic table is generated, based on for example, a formula method, a datasheet method, a lookup table method and a simulation method. The characteristic table can be generated, based on these four methods as described in conjunction with FIG. 2a.

The optimizer unit 304 is operatively coupled to the characteristic table generator 302. The optimizer unit 304 resizes the plurality of transistors in the functional module. The optimizer unit 304 has been further described in conjunction with FIG. 4.

Figure 4:
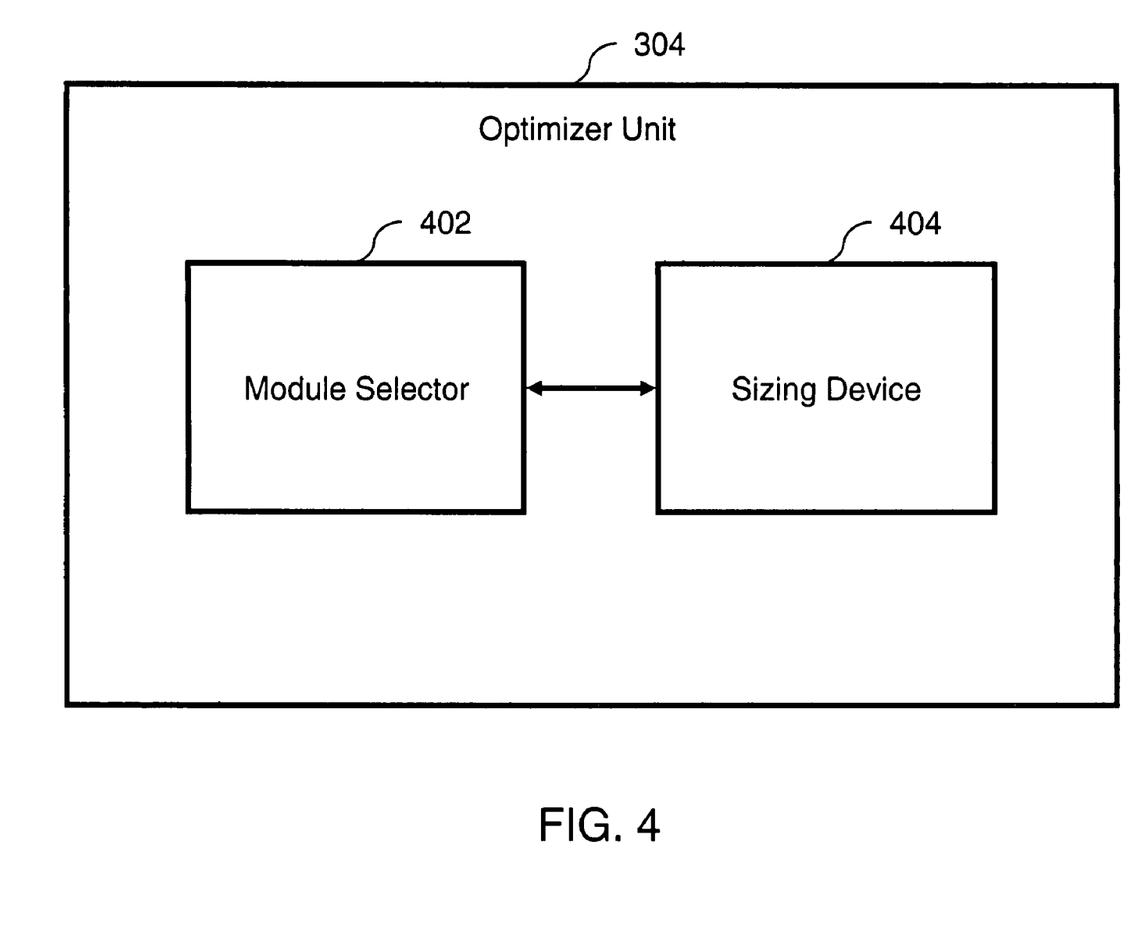
FIG. 4 is a block diagram depicting an optimizer unit, in accordance with an embodiment of the present invention.

FIG. 4 is a block diagram depicting an optimizer unit, in accordance with an embodiment of the present invention. The optimizer unit 304 includes a module selector 402 and a sizing device 404. The module selector 402 selects a functional module from the functional modules in the IC. In an embodiment of the present invention, the module selector 402 automatically selects a functional module. Further, the module selector 402 receives an input load or an output load, or both, corresponding to the functional module. The sizing device 404 calculates a size of each transistor from the plurality of transistors in the functional module. The sizing device 404 is further described in conjunction with FIG. 5.

Figure 5:
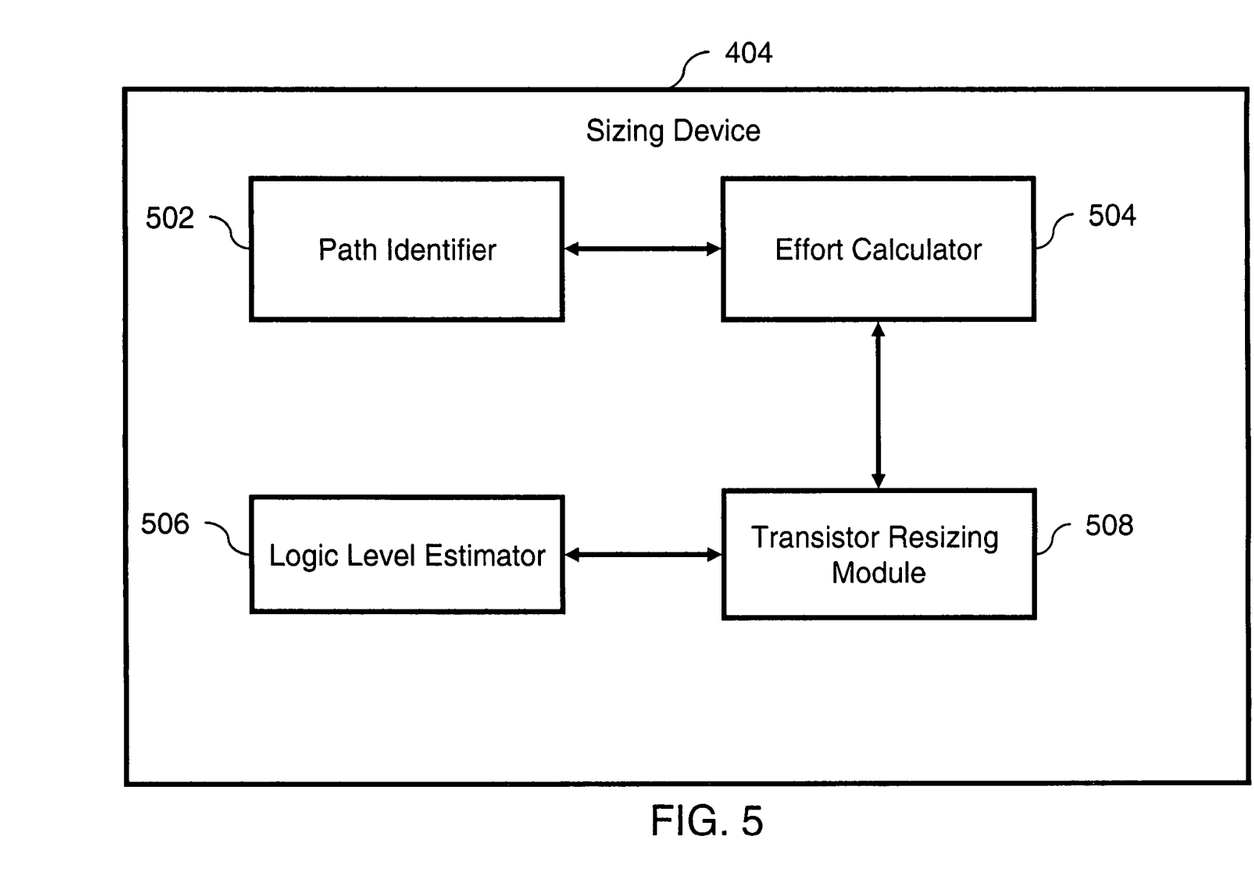
FIG. 5 is a block diagram depicting a sizing device, in accordance with an embodiment of the present invention.

FIG. 5 depicts a block diagram of a sizing device, in accordance with an embodiment of the present invention. The sizing device 404 includes a path identifier 502, an effort calculator 504, a logic level estimator 506, and a transistor-resizing module 508. The path identifier 502 identifies a critical path in the functional module and estimates an optimum number of stages in the critical path. The optimum number of stages is estimated based on a parameter from the set of parameters. This set of parameters include, for example, minimum delay of the critical path, minimum area, power and current of the critical path. The effort calculator 504 calculates a total effort value of the critical path. In an embodiment of the present invention, the logic level estimator 506 determines an estimated logic level corresponding to the output of each logic stage of the critical path based on an output signal transition. In this embodiment, a set of transistors to be sized is determined, based on the estimated logic levels. The transistor resizing module 508 calculates a size corresponding to each set of transistors in the critical path, based on at least one from the following: the characteristic table, the total effort value or the logic level corresponding to the output of each stage in the critical path. Thereafter, the plurality of transistors in the functional module are resized, based on the size of the set of transistors in the critical path.

As described above, the present invention provides a method and a system for optimizing an integrated circuit for at least one parameter from a set of parameters. The method includes generating a characteristic table for the integrated circuit, where the characteristic table includes logical effort values corresponding to each unique logic unit in the integrated circuit. The method is capable of identifying the critical path in a functional module in the integrated circuit. Further, the method automatically calculates the sizes of transistors in all the functional modules in the integrated circuit for minimum delay or minimum area, power and current. As a result, the method eliminates the need for iterations in transistor-level design, especially iterations in sizing the transistors in an integrated circuit. Further, the method calculates the sizes of transistors, based on a requirement of output signal transition. The system is a useful design tool for a novice IC designer since it avoids lengthy calculations in an IC design. The method can improve circuit performance in an Application Specific Integrated Circuit (ASIC) design flow. The circuit performance includes technology migration, improving design flow for leakage sensitive path, solving timing convergence problem between synthesis and layout etc. The method also reduces workload of layout designs since it reduces the repetitions involved in designing layouts corresponding to repetitions in the sizing of transistors.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for optimizing an integrated circuit for at least one parameter from a set of parameters, the integrated circuit comprising one or more functional modules, the one or more functional modules comprising a plurality of transistors, the method comprising:
    generating a characteristic table for the integrated circuit, wherein the characteristic table includes a logical effort value corresponding to each unique logic unit of the integrated circuit;
    selecting a functional module from the one or more functional modules;
    receiving at least one of an input load and an output load corresponding to the functional module; and
    calculating size of the plurality of transistors in the functional module based on the characteristic table and the at least one of the input load and the output load.

2. The method of claim 1, wherein generating the characteristic table comprises:
    identifying the each unique logic unit; and
    calculating the logical effort value corresponding to the each unique logic unit based on a pre-defined criteria.

3. The method of claim 1, wherein generating the characteristic table comprises receiving the logical effort value corresponding to the each unique logic unit as input.

4. The method of claim 1, wherein generating the characteristic table comprises:
    identifying the each unique logic unit;
    receiving a set of delay values with respect to a set of output load values for the each unique logic unit; and
    calculating the logical effort value corresponding to the each unique logic unit based on the set of delay values.

5. The method of claim 1, wherein generating the characteristic table comprises:
    identifying the each unique logic unit;
    calculating a set of delay values with respect to a set of output load values for the each unique logic unit; and
    calculating the logical effort value corresponding to the each unique logic unit based on the set of delay values.

6. The method of claim 1, wherein selecting the functional module comprises selecting a critical path in the functional module, wherein the critical path is associated with an optimum value of a parameter from the set of parameters between an input node and an output node of the critical path.

7. The method of claim 6, wherein selecting the critical path comprises at least one of receiving an identification of the critical path as input and identifying the critical path from one or more logical paths in the functional module.

8. The method of claim 7, wherein identifying the critical path comprises:
    calculating a total effort value corresponding to each of the one or more logical paths; and
    selecting a logical path from the one or more logical paths based on the total effort value corresponding to each of the one or more logical paths.

9. The method of claim 6, wherein calculating the size of the plurality of transistors in the functional module comprises:
    calculating a total effort value of the critical path in the functional module;
    estimating an optimum number of stages in the critical path based on at least one of the total effort value and a parameter from the set of parameters corresponding to the critical path, wherein the parameter has a pre-defined value between the input node and the output node;
    calculating a stage effort value of each stage in the critical path based on at least one of the optimum number of stages and the total effort value of the critical path; and
    estimating the size of the plurality of transistors in the functional module based on the stage effort value of each stage and the characteristic table.

10. The method of claim 9, wherein calculating the total effort value comprises:
    combining a total electrical effort value, a total branch effort value, and a total logical effort value of the critical path.

11. The method of claim 9, wherein estimating the size of the plurality of transistors in the functional module comprises:
    calculating an input capacitance of each stage in the critical path based on the stage effort value of the each stage and the characteristic table;
    calculating the size of each transistor in a set of transistors in the critical path based on the input capacitance; and resizing the plurality of transistors in the functional module based on the size of the each transistor in the set of transistors.

12. The method of claim 9, wherein estimating the optimum number of stages comprises calculating total number of stages based on at least one of the total effort value and a set of step values of the critical path, wherein the parameter is an optimum area for the critical path.

13. A method for optimizing an integrated circuit for at least one parameter of a set of parameters, the integrated circuit comprising one or more functional modules, the one or more functional modules comprising a plurality of transistors, the method comprising:
   generating a characteristic table of the integrated circuit, wherein the characteristic table includes a logical effort value corresponding to each unique logic unit in the integrated circuit;
   selecting a functional module from the one or more functional modules;
   receiving at least one of an input load and an output load corresponding to the functional module;
   selecting an output signal transition corresponding to the functional module;
   identifying a set of transistors from the plurality of transistors based on the output signal transition; and
   calculating size of the plurality of transistors in the functional module based on the characteristic table, the at least one of the input load and the output load, and the identification of the set of transistors.

14. The method of claim 13, wherein generating the characteristic table comprises:
   identifying the each unique logic unit; and
   calculating the logical effort value corresponding to the each unique logic unit based on a pre-defined criterion.

15. The method of claim 13, wherein generating the characteristic table comprises receiving the logical effort value corresponding to the each unique logic unit as input.

16. The method of claim 13, wherein generating the characteristic table comprises:
   identifying the each unique logic unit;
   receiving a set of delay values with respect to a set of output load values for the each unique logic unit; and
   calculating the logical effort value corresponding to the each unique logic unit based on the set of delay values.

17. The method of claim 13, wherein generating the characteristic table comprises:
   identifying the each unique logic unit;
   calculating a set of delay values with respect to a set of output load values for the each unique logic unit; and
   calculating the logical effort value corresponding to the each unique logic unit based on the set of delay values.

18. The method of claim 13, wherein selecting the functional module comprises selecting a critical path in the functional module, wherein the critical path is associated with an optimum value of a parameter from the set of parameters between an input node and an output node.

19. The method of claim 18, wherein the set of transistors identified from the plurality of transistors is present in the critical path.

20. The method of claim 19, wherein calculating the size of the plurality of transistors in the functional module comprises:
   calculating a total effort value of the critical path in the functional module;
   estimating an optimum number of stages in the critical path based on at least one of the total effort value and a parameter from the set of parameters corresponding to the critical path, wherein the parameter has a pre-defined value between the input node and the output node;
   calculating a stage effort value of each stage in the critical path based on at least one of the optimum number of stages and the total effort value of the critical path; and
   estimating the size of the plurality of transistors in the functional module based on the stage effort value of each stage, the characteristic table and the identification of the set of transistors.

21. The method of claim 20, wherein estimating the size of the plurality of transistors in the functional module comprises:
   calculating an input capacitance of each stage in the critical path based on the stage effort value of the each stage and the characteristic table;
   determining a logic level corresponding to the output of each stage based on the output signal transition;
   calculating size of each transistor in the set of transistors based on the input capacitance and the logic level; and
   resizing the plurality of transistors in the functional module based on the size of each transistor in the set of transistors.

22. A system for optimizing an integrated circuit for at least one parameter from a set of parameters, the integrated circuit comprising one or more functional modules, each of the one or more functional modules comprising a plurality of transistors, the system comprising:
   a characteristic table generator capable of generating a characteristic table, wherein the characteristic table includes a logical effort value corresponding to each unique logic unit in the integrated circuit; and
   an optimizer unit operatively coupled to the characteristic table generator, the optimizer unit further comprising:
      a module selector capable of selecting a functional module from the one or more functional modules and receiving at least one of an input load and an output load corresponding to the functional module: and
      a sizing device capable of calculating a size corresponding to each of the plurality of transistors.

23. The system of claim 22, wherein the characteristic table generator generates the characteristic table based on at least one of a formula, a datasheet, a lookup table and a simulation method.

24. The system of claim 22, wherein the sizing device comprises:
   a path identifier capable of identifying a critical path in the functional module and estimating an optimum number of stages of the critical path, wherein the optimum number of stages is estimated based on a parameter from the set of parameters;
   an effort calculator capable of calculating a total effort value of the critical path;
   a logic level estimator of capable determining a logic level corresponding to the output of each stage based on an output signal transition; and
   a transistor resizing module capable of calculating a size corresponding to each of a set of transistors in the critical path based on at least one of the characteristic table, the total effort and the logic level.

* * * * *